United States Patent [19]

Caster

[11] Patent Number: 4,693,768

[45] Date of Patent: Sep. 15, 1987

[54] ART PRODUCTION METHOD UTILIZING CAST COATED PAPER FOR PREPARATION OF CAMERA-READY ART

[75] Inventor: Wayne L. Caster, 2908 Mockingbird La., Bloomington, Ill. 61701

[73] Assignee: Wayne L. Caster, Bloomington, Ill.

[21] Appl. No.: 765,913

[22] Filed: Aug. 14, 1985

[51] Int. Cl.$^4$ .............................................. B32B 31/12
[52] U.S. Cl. ...................................... 156/62; 156/277; 354/292; 427/288
[58] Field of Search .......................... 354/292; 40/615; 156/63, 62, 277; 427/362, 288

[56] References Cited

U.S. PATENT DOCUMENTS 3,499,377  3/1970  Esses .................................... 354/292

OTHER PUBLICATIONS

*Kromkote . . . A User's Guide,* brochure, Champion International Corporation, Paper Division, 1981, pp. 1–12.
"Be a Winner with Line Kote 220", advertisement, Wheeling, Illinois, Crescent Cardboard Company.
*Art Product News,* Sep./Oct. 1984, pp. 46–47.
*Imagination* 25, brochure, Champion International Corporation, 1985, cover sheet.

*Primary Examiner*—Evan K. Lawrence
*Attorney, Agent, or Firm*—Ladas & Parry

[57] ABSTRACT

An art production method involving the use of cast clay-coated paper instead of conventional board stock utilized for setting up mechanicals, etc. suitable for printing and other purposes providing a more readily inked surface as well as one which can be easily corrected by scraping or scratching out undersired inked portions, and where the hard, smooth surface of the cast coated material has sufficient strength and durability to resist peeling or tearing occasioned by the application and removal of adhesive tapes to the surface.

4 Claims, 4 Drawing Figures

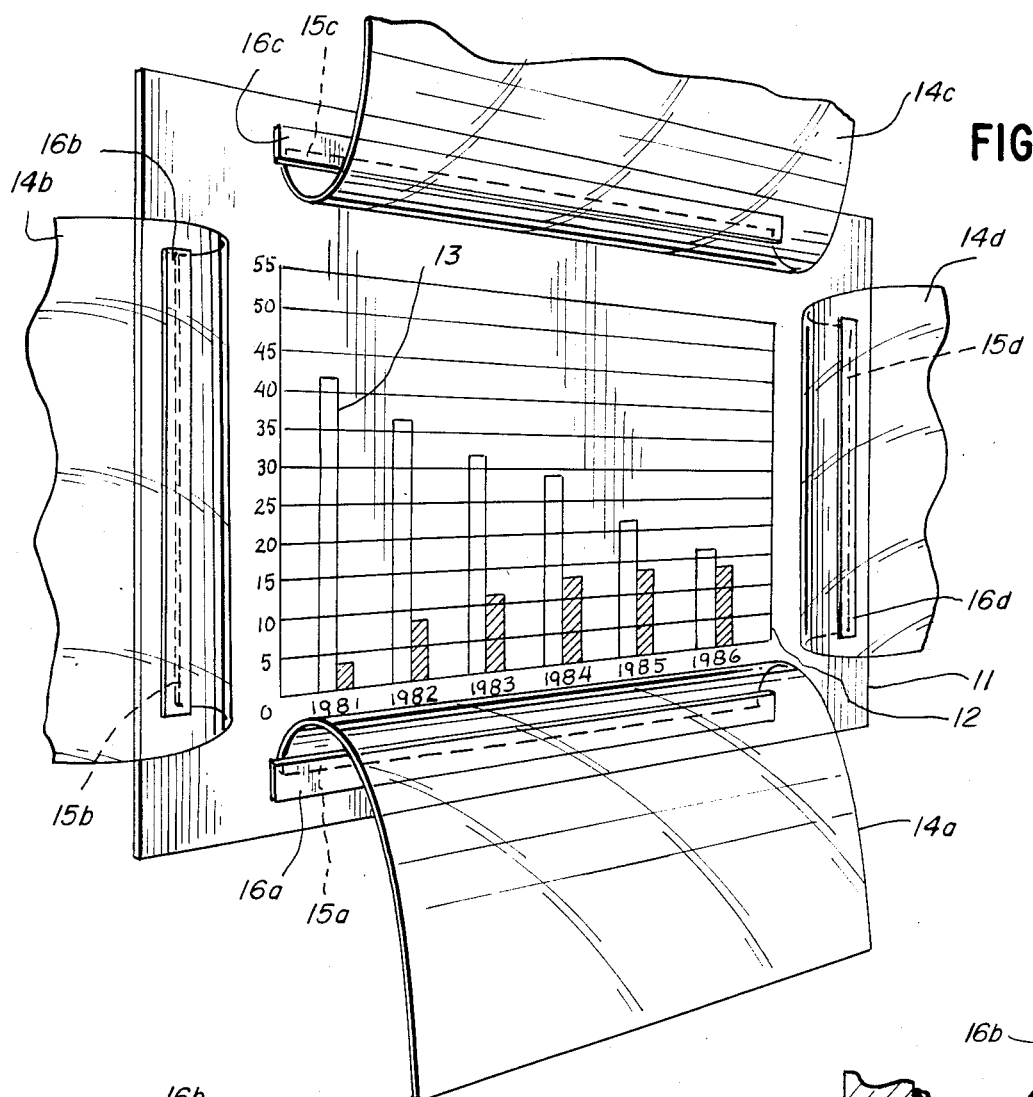
FIG. 1
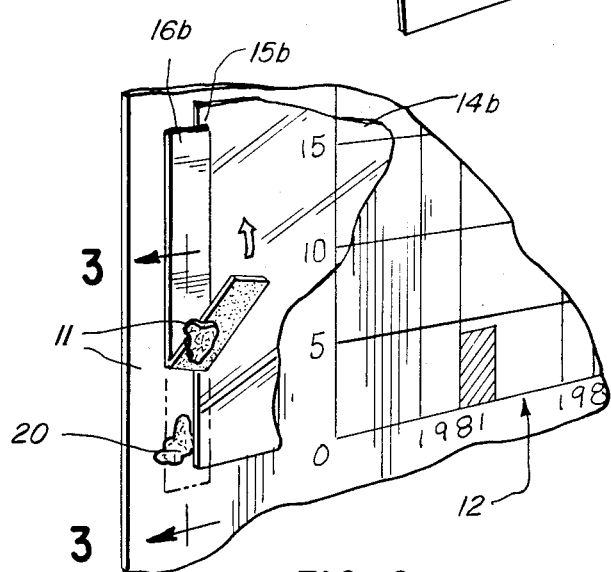
FIG. 2
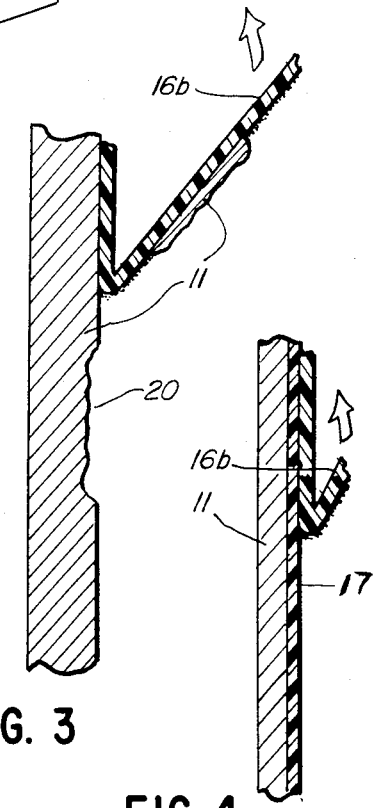
FIG. 3
FIG. 4 ardiffe
ART PRODUCTION METHOD UTILIZING CAST COATED PAPER FOR PREPARATION OF CAMERA-READY ART This invention relates to art production methods and materials and, more particularly, to the application and use of cast coated paper in the preparation of camera-ready art.

Commerical artists in the proces of setting up mechanicals, paste ups, key lines, etc. for printing and other purposes customarily use a relatively heavy board stock which can receive easily reproducible ink lines as well as having sufficient strength to accept paste ups i.e., multiple overlays applied to the surface of the board using various types of adhesive tapes and the like. Many different types of boards have been used in the past ranging from so-called illustration or poster boards to boards produced by so-called hot press or cold press techniques. In addition clay-coated boards have been used. Each of these different types of boards possess certain individual characteristics together with relative advantages and disadvantages. Some can be inked more easily than others while other types of boards may tend to clog the technical pens used by commerical artists.

In general, most of the boards being used for art production are of heavy stock of considerable thickness. Due to their thickness their boards are usually available in single sheet form and of substantial dimensions such that an artist is required to cut the board down to the desired size. It would be desirable to provide a media for art production work that could be made available in convenient size in bulk quantities in "pads".

It is evident that a proper board for art production purposes should have a smooth surface such that it can be inked with clean and sharp lines. It is also important that the board surface does not chalk or clog the technical inking pens used in commercial art work. Since the board is used as a base for receiving multiple overlays that are mounted to the board using adhesive tapes or cement, it is necessary that the board surface be resistant to peeling or tearing that can occur when layout elements on the board must be moved. Another drawback found in the use of certain boards for art production work involve the difficulty of scraping or scratching out inked lines on the board surface without marring the surface.

SUMMARY OF THE INVENTION

The invention relates to the production of commercial art work in which one or more clear overlays are detachably mounted by suitable adhesive means on the surface of an art production board that has inked indicia applied thereon, and wherein the improvement comprises using as the production board a cast-coated paper having a clay coating exhibiting a glossy surface of such hardness that chalking of the surface is not a problem and clogging of the ink pens used in the art production presents no difficulty. Also, this cast-coated paper possesses sufficient strength and durability such that errors or changes in the inked indicia applied to the board may be readily corrected by scraping away the undesired inked indicia without marring the surface. Further, the hard, smooth surface of the cast-coated paper permits repeated mounting and removal of the adhesive-backed overlays on the paper surface without marring of the surface.

The object of the present invention is to provide, in a process of producing commercial art work, a media suitable for art production purposes which avoids most if not all of the aforesaid drawbacks found with boards currently being used for this purpose.

A more specific object of the invention is to employ as the new media a cast coated sheet material which heretofore has been used exclusively as a printing paper in making up container labels, special packaging or as covers for magazine or soft-cover books. The so-called cast coating process provides a high gloss, hard, smooth surface making it an exceptional printing paper due to its brillant color reproduction and overall strength. These exceptional qualities as a printing paper have overcome the fact that such these cast-coated papers are among the most expensive printing papers available today.

A further object is to provide a novel media for art production purposes suitable for multiple sheet or pad format due to the availability for the first time of sheets of substantially reduced thickness as compared to the boards currently used for art production purposes.

Another object is to provide a novel media for art production purposes which is especially adapted to be pre-printed with guidelines for frequently used formats utilized in art production work.

The foregoing objects together with further features and advantages of the present invention will become more evident from the following description of preferred embodiments of the present invention taken together with the accompanying drawings wherein:

FIG. 1 is a plan view of a conventional board used in setting up a typical art production layout; and FIG. 2 is a partial view of Figure 1 illustrating a drawback of a conventional board stock used as the board in the make-up of the layout shown in FIG. 1.

FIG. 3 is a partial cross-sectional view of the conventional board stock shown in FIG. 2 taken along the line 3—3.

FIG. 4 is a partial cross-sectional view similar to FIG. 3 but taken thru a cast coated board as taught by the present invention.

One of the major areas of commercial art work today involves the setting up and arrangement of drawn or pictorial material to be reproduced which must be set up on an art board and which material is thereafter transferred to a printing press using known photo-techniques. The actual process of mounting the artwork on the board is commonly referred to as: keylining, production, final art paste-up or mechanical. In substance all of these procedures aim at producing the same thing, namely, a camera-ready board carrying the desired art work.

FIG. 1 shows the make-up of a typical camera-ready board 11 on which the artist has drawn, by way of example, portions of a graph 12. Graph 12 is in the form of a typical bar chart and illustrates, for example, comparative sales of two different products occurring over a number of years. To provide a multi-colored display of the individual bars 13 on the graph 12 the bars 13 on the graph 12 are made up in composite colored form using several overlapping, clear overlays 14a, 14b, 14c, and 14d. Each of these overlays 14a–14d have selected differing colored segments (not shown) of the composite bars 13 provided therein by the artist. An edge 15a–15d of each overlay 14a–14d is detachably affixed to the surface of the board 11 by any suitable means such as an adhesive strip 16a–16d as shown in FIG. 1.

With each overlay 14a-14d mounted in superposed relation on the board 11, a multi-colored bar chart is thus presented which is "camera-ready". In other words, the board 11 with the art work mounted therein is now ready for the customary steps and procedures used in producing a printing plate or plates that can be then used in a printing press to produce the desired printed illustration of the art work on board 11.

The board 11 conventionally may be of many different kinds ranging from, hot press, cold press, illustration, clay coated, or poster board. Each of these have their own individual characteristics, advantages, and disadvantages. Some can be inked more easily than others, others may tend to clog technical pens. Certain ones peel when elements need to be moved. Most all are very thick and expensive because they are sold in single sheets (large) and must be cut down by the artist. None of the commercially available mechanical boards today are able to be sold in bulk quantities that are sold in "pads".

It has been found that a so-called cast-coated paper will provide an excellent material for the board 11 since it readily accepts easily reproducible inked lines while possessing sufficient strength to serve as a base for paste-ups without any peeling.

In general this type of paper is produced using a process in which the paper with a coating of clay or the like in a highly plastic condition is pressed against a solid surface which usually comprises a highly polished heated cylinder such that the finish on the paper is similar to that of the cylinder surface.

A cast coated paper, therefore, is defined as a paper or board having a coating which is allowed to harden or set while in contact with a finished casting surface. In general, cast-coated paper has a high gloss and can be made with good ink receptivety while presenting a surface that is highly impervious and durable.

Cast-coated papers are currently available in a variety of conventional thickness such that an artist can select a specific thickness which would be suitable for his intended purposes. In general, however, the thickness of a sheet of cast-coated paper in comparison to conventional board stock is much less. For example, cast-coated paper ranging in thickness between about 0.002 inches to 0.020 inches and preferably from about 0.008 inches to 0.012 inches may be employed as an art production media in accordance with my invention. This comparative thiness greatly facilitates the storage of art boards made of cast-colored paper and allows the material to be "padded" for the ease and convenience of the commercial artist.

One suitable type of cast-coated paper that exhibits the properties needed for my purposes is a paper sold under the trademark "Kromekote" by the Champion Paper Company. While this "Kromekote" paper has been sold and used as a printing paper over the last 30 or 40 years, it has never been used according to my understanding for the specific purpose of an art production media or board.

While cast-coated papers such as the "Kromekote" paper are generally considered one of the most expensive papers for general printing purposes, the use of such papers as an art production media or board offers substantial cost savings. For example, a single sheet of "Kromekote" board cast-coated paper 24"×32" in dimension costs $0.24 retail while a typical commercial art boardstock such as a "Linekote" board of 24"×32" size costs $1.78, retail. Greater savings could be achieved in bulk purchases or where the cast-coated paper is "padded" into blocks of 30 or so sheets for sale to commerical artists.

In addition to being of much lighter stock and costing a fraction of that required for heavy board stock, cast-coated paper as employed in my invention has a number of important advantages over conventional board stock. In the first place, the adhesive strips 16a-16d used to secure the overlays 14a-14d to a board 11 made of cast-coated paper 16a-16d will not cause any peeling of the board surface nor undesired removal of inked lines from the original sheet, as would be the case where such adhesive strips are used with a board 11 made of ordinary board stock.

FIGS. 2 and 3 are partial views of FIG. 1 showing how the removal of one of the adhesive strips 15b from the surface of board 11 made of conventional board stock material can produce a partial peeling of the board surface as shown at 20. By substitution of a cast-coated paper for the conventional board material in the board 11, this problem can be avoided as shown in FIG. 4 due to the interposition of the cast coating 17 on the board 11.

Another advantage of this cast-coated paper stock over the heavy board stock is that line removal or erasure can be done neatly with a sharp knife or razor without marring the surface and eliminating the need to use "white-out" or the like.

Due to the hardness of the cast-coated paper surface, chalking of the surface is not a problem nor is there any difficulty in the clogging of technical inking pens which can occur with conventional board stocks.

Further, the brillance of the cast-coated paper surface will not discolor with age and the durability of the paper enables it to withstand extensive hardling and repositioning of art work on the paper surface without damage. Due to the resiliency of the cast-coated paper problems of warping due to exces humidity and temperature are avoided.

A further advantage of utilizing cast-coated paper as an art production board is that such paper can be easily pre-printed with guidelines for often used formats.

I claim:

1. In the process of producing commercial art work using an art production board with a surface to which inked indicia are applied and having one or more clear overlays juxtaposed to said board surface and to one another and with each overlay being detachably mounted on said board surface by suitable adhesive means, the improved step of employing as said board a cast-coated paper having a clay coating exhibiting a glossy surface of such hardness that chalking of the surface is not a problem and clogging of a pen used to apply inked indicia to the surface presents no difficulty, said cast-coated paper also possessing sufficient strength and durability such that errors in the application of inked indicia to said cast-coated paper surface may be readily corrected by scraping away the undesired material without marring the surface and whereby removal of said adhesive means mounting said overlays on said cast-coated paper surface also will not mar the cast-coated paper surface.

2. In the process of claim 1, further including the step of pre-printing guidelines for often used formats on the surface of said cast-coated paper prior to the application of said inked indicia thereto.

3. In the process of claim 1, wherein the thickness of the cast-coated paper employed as an art production board is from about 0.002 inches to 0.020 inches.

4. In the process of claim 1, wherein the thickness of the cast-coated paper employed as an art production board is from about 0.008 inches to 0.012 inches.

* * * * *